(12) United States Patent
Nagatomi

(10) Patent No.: US 11,687,138 B2
(45) Date of Patent: *Jun. 27, 2023

(54) POWER SUPPLYING SYSTEM, ELECTRONIC APPARATUS, AND POWER SUPPLYING METHOD

(71) Applicant: FUJIFILM Corporation, Tokyo (JP)

(72) Inventor: Takashi Nagatomi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/590,330

(22) Filed: Feb. 1, 2022

(65) Prior Publication Data

US 2022/0155842 A1    May 19, 2022

Related U.S. Application Data

(63) Continuation of application No. 16/418,080, filed on May 21, 2019, now Pat. No. 11,275,422, which is a (Continued)

(30) Foreign Application Priority Data

Dec. 19, 2016 (JP) .............................. JP2016-245841

(51) Int. Cl.
G06F 1/00 (2006.01)
G06F 11/30 (2006.01)
(Continued)

(52) U.S. Cl.
CPC .......... *G06F 1/30* (2013.01); *G01R 19/16542* (2013.01); *G06F 1/26* (2013.01);
(Continued)

(58) Field of Classification Search
CPC ..... G06F 1/30; G06F 1/26; G06F 1/28; G06F 1/263; G01R 19/16542; H01M 10/48; (Continued)

(56) References Cited

U.S. PATENT DOCUMENTS

2003/0030412 A1    2/2003  Matsuda et al.
2007/0008011 A1    1/2007  Thurston
(Continued)

FOREIGN PATENT DOCUMENTS

CN    102176629 A    9/2011
CN    102955553 A    3/2013
(Continued)

OTHER PUBLICATIONS

International Preliminary Report on Patentability and Written Opinion of the International Searching Authority (Forms PCT/IB/326, PCT/IB/373, and PCT/ISA/237) for International Application No. PCT/JP2017/040167, dated Jul. 4, 2019, with English translation.
(Continued)

*Primary Examiner* — Xuxing Chen
(74) *Attorney, Agent, or Firm* — Birch, Stewart, Kolasch & Birch, LLP

(57) ABSTRACT

In a power supplying system, a selection unit that selects one of a first power feed unit and a second power feed unit, a first voltage determination unit that compares a voltage of an output of the first power feed unit with a first threshold value, a second voltage determination unit that compares a voltage of an output of the second power feed unit with a second threshold value, and a management unit that sets the first threshold value and the second threshold value are provided.

15 Claims, 10 Drawing Sheets

Related U.S. Application Data continuation of application No. PCT/JP2017/040167, filed on Nov. 8, 2017.

(51) Int. Cl.
| | | |
|---|---|---|
| *G06F 1/30* | (2006.01) | |
| *G01R 19/165* | (2006.01) | |
| *G06F 1/28* | (2006.01) | |
| *H02J 7/34* | (2006.01) | |
| *H02J 9/06* | (2006.01) | |
| *H02J 7/00* | (2006.01) | |
| *H01M 10/48* | (2006.01) | |
| *G06F 1/26* | (2006.01) | |

(52) U.S. Cl.
CPC .............. *G06F 1/28* (2013.01); *H01M 10/48* (2013.01); *H02J 7/00* (2013.01); *H02J 7/34* (2013.01); *H02J 9/06* (2013.01)

(58) Field of Classification Search
CPC ........ H02J 7/00; H02J 7/34; H02J 9/06; H02J 1/084; H02J 9/061; Y02E 60/10
See application file for complete search history.

(56) References Cited

U.S. PATENT DOCUMENTS

| | | |
|---|---|---|
| 2013/0020875 A1 | 1/2013 | Wozniak et al. |
| 2013/0043929 A1 | 2/2013 | Chen |
| 2013/0326237 A1 | 12/2013 | Holdengreber et al. |
| 2014/0015320 A1 | 1/2014 | Takano et al. |
| 2015/0028800 A1 | 1/2015 | Kim |
| 2016/0077562 A1 | 3/2016 | Smith |
| 2016/0099608 A1 | 4/2016 | Jao et al. |
| 2016/0126757 A1 | 5/2016 | Hirosawa et al. |
| 2016/0140911 A1 | 5/2016 | Kim et al. |
| 2017/0177069 A1* | 6/2017 | Bedare .................... G06F 1/263 |
| 2018/0302804 A1* | 10/2018 | Eleftheriadis ....... H04W 36/165 |

FOREIGN PATENT DOCUMENTS

| | | |
|---|---|---|
| EP | 0910089 A2 | 4/1999 |
| JP | 11-89113 A | 3/1999 |
| JP | 11-119876 A | 4/1999 |
| JP | 2002-199600 A | 7/2002 |
| JP | 2003-29885 A | 1/2003 |
| JP | 2004-152317 A | 5/2004 |
| JP | 2016-12958 A | 1/2016 |

OTHER PUBLICATIONS

International Search Report (Form PCT/ISA/210) for International Application No. PCT/JP2017/040167, dated Dec. 19, 2017, with English translation.

Notice of Allowance issued in copending U.S. Appl. No. 16/418,080 dated Dec. 15, 2021.

Chinese Office Action and Search Report for corresponding Chinese Application No. 201780075690.9, dated Sep. 8, 2022, with an English translation.

* cited by examiner

FIG. 5

|  | RECEIVABLE POWER | FIRST CONDITION | SECOND CONDITION |
|---|---|---|---|
| ELECTRONIC APPARATUS | EXTERNAL POWER | YES | YES (AT LEAST ONE) |
| ELECTRONIC APPARATUS | INTERNAL POWER OF FIRST BATTERY | NO | YES (AT LEAST ONE) |
| CONNECTION APPARATUS | EXTERNAL POWER | YES (AT LEAST ONE) | YES |
| CONNECTION APPARATUS | INTERNAL POWER OF SECOND BATTERY | YES (AT LEAST ONE) | NO |
| THRESHOLD VALUE | | FIRST THRESHOLD VALUE > SECOND THRESHOLD VALUE | FIRST THRESHOLD VALUE < SECOND THRESHOLD VALUE |

POWER SUPPLYING SYSTEM, ELECTRONIC APPARATUS, AND POWER SUPPLYING METHOD

CROSS-REFERENCE TO RELATED APPLICATIONS

This application is a Continuation of copending U.S. application Ser. No. 16/418,080 filed on May 21, 2019, which is a Continuation of PCT International Application No. PCT/JP2017/040167 filed on Nov. 8, 2017, which claims priority under 35 U.S.C. § 119(a) to Japanese Patent Application No. 2016-245841 filed on Dec. 19, 2016. Each of the above application(s) is hereby expressly incorporated by reference, in its entirety, into the present application.

BACKGROUND OF THE INVENTION

1. Field of the Invention

The present invention relates to a power supplying system, an electronic apparatus, and a power supplying method capable of surely preventing an abnormal end even in a case where supply of external power is disconnected in an apparatus having no battery with a valid voltage.

2. Description of the Related Art

In the related art, there is a known technique of preferentially using power from an external alternating current (AC) adapter of an electronic apparatus rather than power from an internal battery of the electronic apparatus.

JP2003-029885A discloses a configuration in which two electronic apparatuses are connected by a cable having a data communication line and a power supply supplying line, and a power supply situation of the other electronic apparatus is determined by communication with the other electronic apparatus through the data communication line and a power supply situation of own electronic apparatus is also determined to supply the power from the AC adapter from one electronic apparatus to the other electronic apparatus through the power supply supplying line in a case where the AC adapter is connected to only one electronic apparatus.

JP2002-199600A discloses a configuration in which a first battery for operation and a second battery for standby are included, and a voltage of the first battery converted to a digital signal through an analog to digital (AD) converter and a certain threshold value stored in advance are compared to switch a supplying source of the power from the first battery to the second battery in a case where the voltage of the first battery is lower than the threshold value.

SUMMARY OF THE INVENTION

In an apparatus having no battery with a valid voltage between the electronic apparatus and a connection apparatus connectable to the electronic apparatus, the apparatus may be abnormally ended in a case where supply of external power is disconnected.

In a case where a cable of the AC adapter is removed from one electronic apparatus having no battery with the valid voltage, the power supplying from the AC adapter is instantaneously disconnected even using the technique disclosed in JP2003-029885A. Therefore, in a case where switching of the power supplying to the power of a battery in the other electronic apparatus is delayed, the abnormal end may occur.

JP2002-199600A discloses the configuration of switching the supplying source of the power from the first battery for operation to the second battery for standby. However, there is no disclosure on a configuration in which the apparatus is not abnormally ended in a case where the power supplying from an external power supply such as the AC adapter is disconnected. In a case where the technique disclosed in JP2002-199600A is adopted for an electronic apparatus using the external power, the abnormal end of the apparatus may not be prevented in a case where it takes time from the disconnection of the external power supplying to the completion of disconnection detection and the switching of the power supplying.

The invention is made in consideration of such circumstances, and a purpose of the invention is to provide a power supplying system, an electronic apparatus, and a power supplying method capable of surely preventing the abnormal end even in the case where the supply of the external power is disconnected in the apparatus having no battery with the valid voltage.

In order to achieve the purpose described above, a power supplying system according to a first aspect of the invention includes an electronic apparatus and a connection apparatus connectable to the electronic apparatus, and comprises a first power feed unit that is provided in the electronic apparatus, is capable of receiving internal power from a first battery in the electronic apparatus and of receiving external power from an external power supply corresponding to a voltage higher than a valid battery voltage of the first battery, and preferentially outputs the external power rather than the internal power from the first battery, a second power feed unit that is provided in the connection apparatus, is capable of receiving internal power from a second battery in the connection apparatus and of receiving the external power from the external power supply corresponding to a voltage higher than a valid battery voltage of the second battery, and preferentially outputs the external power rather than the internal power from the second battery, a selection unit that selects one of the first power feed unit and the second power feed unit as a supplying source of use power of the electronic apparatus, a first voltage determination unit that compares a voltage of an output of the first power feed unit with a first threshold value to determine whether the output of the first power feed unit is valid or invalid, a second voltage determination unit that compares a voltage of an output of the second power feed unit with a second threshold value to determine whether the output of the second power feed unit is valid or invalid, and a management unit, causing the selection unit to preferentially select a power feed unit that receives the external power between the first power feed unit and the second power feed unit and setting the first threshold value and the second threshold value, that sets the first threshold value to be higher than the second threshold value in a first condition where the first power feed unit that receives the external power is selected by the selection unit and there is no first battery with the valid battery voltage, and that sets the second threshold value to be higher than the first threshold value in a second condition where the second power feed unit that receives the external power is selected by the selection unit and there is no second battery with the valid battery voltage. The selection unit switches a selection destination to the second power feed unit in a case where the output of the first power feed unit is determined to be invalid by the first voltage determination unit and the output of the second power feed unit is determined to be valid by the second voltage determination unit in a state where the first power feed unit is selected, and switches the selection destination to the first power feed unit in a case where the output of the second power feed unit is determined to be invalid by the second voltage determination unit and the output of the first power feed unit is determined to be valid by the first voltage determination unit in a state where the second power feed unit is selected.

According to this aspect, it is possible to surely prevent the abnormal end even in the case where the supply of the external power is instantaneously disconnected in the apparatus having no battery with the valid voltage.

In the power supplying system according to a second aspect of the invention, the selection unit completes the switching to the second power feed unit until the voltage of the output of the first power feed unit drops to the second threshold value in the case where the selection destination is switched from the first power feed unit to the second power feed unit in the first condition, and completes the switching to the first power feed unit until the voltage of the output of the second power feed unit drops to the first threshold value in the case where the selection destination is switched from the second power feed unit to the first power feed unit in the second condition.

In the power supplying system according to a third aspect of the invention, the management unit sets a voltage value to be higher than a valid voltage of the battery and lower than a voltage corresponding to the external power supply as a higher threshold value between the first threshold value and the second threshold value.

In the power supplying system according to a fourth aspect of the invention, the management unit sets a voltage value which is equal to or less than the valid voltage of the battery as a lower threshold value between the first threshold value and the second threshold value.

In the power supplying system according to a fifth aspect of the invention, the first voltage determination unit compares the voltage of the output of the first power feed unit with the first threshold value in analog, and the second voltage determination unit compares the voltage of the output of the second power feed unit with the second threshold value in analog.

The power supplying system according to a sixth aspect of the invention further comprises a reverse current prevention circuit that prevents a current from flowing from one external power supply to the other external power supply of the external power supply connected to the first power feed unit and the external power supply connected to the second power feed unit.

The power supplying system according to a seventh aspect of the invention further comprises a power supply OR circuit that receives the output of the first power feed unit and the output of the second power feed unit, and supplies the power to the management unit.

An electronic apparatus according to an eighth aspect of the invention is an electronic apparatus to which a connection apparatus is connectable, and comprises a power feed unit that is capable of receiving internal power from a battery provided in the electronic apparatus and of receiving external power from an external power supply corresponding to a voltage higher than a valid battery voltage of the battery, and preferentially outputs the external power rather than the internal power from the battery, a connection apparatus power input terminal to which the power from the connection apparatus is input, a selection unit that selects one of the power feed unit and the connection apparatus as a supplying source of use power of the electronic apparatus, a voltage determination unit that compares a voltage of an output of the power feed unit with a threshold value to determine whether the output of the power feed unit is valid or invalid, and a management unit that sets a voltage value which is equal to or less than the valid voltage of the battery as the threshold value, and sets a voltage value to be higher than the valid voltage of the battery and lower than a voltage corresponding to the external power supply as the threshold value in a condition where the power feed unit that receives the external power is selected by the selection unit and there is no battery with the valid battery voltage. The selection unit switches a selection destination to the connection apparatus in a case where the output of the power feed unit is determined to be invalid by the voltage determination unit in a state where the power feed unit is selected.

An electronic apparatus according to a ninth aspect of the invention is an electronic apparatus to which a connection apparatus is connectable, and comprises a first power feed unit that is capable of receiving internal power from a first battery and of receiving external power which is a voltage higher than a valid battery voltage of the first battery, and preferentially outputs the external power rather than the internal power from the first battery, a connection apparatus power input terminal electrically connected to a second power feed unit that is provided in the connection apparatus, the second power feed unit is capable of receiving internal power from a second battery and of receiving the external power which is a voltage higher than a valid battery voltage of the second battery, and the second power feed unit preferentially outputs the external power rather than the internal power from the second battery, a selection unit that selects one of the first power feed unit and the second power feed unit and sets the selected power feed unit as a supplying source of use power of the electronic apparatus, a first voltage determination unit that compares a voltage of an output of the first power feed unit with a first threshold value to determine whether the output of the first power feed unit is valid or invalid, a second voltage determination unit that compares a voltage of an output of the second power feed unit with a second threshold value to determine whether the output of the second power feed unit is valid or invalid, and a management unit, causing the selection unit to preferentially select a power feed unit that receives the external power between the first power feed unit and the second power feed unit and setting the first threshold value and the second threshold value, that sets the first threshold value to be higher than the second threshold value in a first condition where the first power feed unit that receives the external power is selected by the selection unit and there is no first battery with the valid battery voltage, and that sets the second threshold value to be higher than the first threshold value in a second condition where the second power feed unit that receives the external power is selected by the selection unit and there is no second battery with the valid battery voltage. The selection unit switches a selection destination to the second power feed unit in a case where the output of the first power feed unit is determined to be invalid by the first voltage determination unit and the output of the second power feed unit is determined to be valid by the second voltage determination unit in a state where the first power feed unit is selected, and switches the selection destination to the first power feed unit in a case where the output of the second power feed unit is determined to be invalid by the second voltage determination unit and the output of the first power feed unit is determined to be valid by the first voltage determination unit in a state where the second power feed unit is selected.

A power supplying method according to a tenth aspect of the invention is a power supplying method that supplies power to the electronic apparatus using a first power feed unit that is provided in the electronic apparatus, is capable of receiving internal power from a first battery and of receiving external power which is a voltage higher than a valid battery voltage of the first battery, and preferentially outputs the external power rather than the internal power from the first battery, a second power feed unit that is provided in the connection apparatus connectable to the electronic apparatus, is capable of receiving internal power from a second battery and of receiving the external power which is a voltage higher than a valid battery voltage of the second battery, and preferentially outputs the external power rather than the internal power from the second battery, a selection unit that selects one of the first power feed unit and the second power feed unit and sets the selected power feed unit as a supplying source of use power of the electronic apparatus, a first voltage determination unit that compares a voltage of an output of the first power feed unit with a first threshold value to determine whether the output of the first power feed unit is valid or invalid, and a second voltage determination unit that compares a voltage of an output of the second power feed unit with a second threshold value to determine whether the output of the second power feed unit is valid or invalid, and comprises causing the selection unit to preferentially select a power feed unit that receives the external power between the first power feed unit and the second power feed unit, setting the first threshold value to be higher than the second threshold value in a first condition where the first power feed unit that receives the external power is selected by the selection unit and there is no first battery with the valid battery voltage, setting the second threshold value to be higher than the first threshold value in a second condition where the second power feed unit that receives the external power is selected by the selection unit and there is no second battery with the valid battery voltage, switching a selection destination to the second power feed unit by the selection unit in a case where the output of the first power feed unit is determined to be invalid by the first voltage determination unit and the output of the second power feed unit is determined to be valid by the second voltage determination unit in a state where the first power feed unit is selected by the selection unit, and switching the selection destination to the first power feed unit by the selection unit in a case where the output of the second power feed unit is determined to be invalid by the second voltage determination unit and the output of the first power feed unit is determined to be valid by the first voltage determination unit in a state where the second power feed unit is selected by the selection unit.

According to the invention, it is possible to surely prevent the abnormal end even in the case where the supply of the external power is disconnected in the apparatus having no battery with the valid voltage.

BRIEF DESCRIPTION OF THE DRAWINGS

FIG. 5 is an explanatory diagram used to describe a threshold value setting.

DESCRIPTION OF THE PREFERRED EMBODIMENTS

Hereinafter, forms for implementing a power supplying system, an electronic apparatus, and a power supplying method according to the invention will be described with reference to accompanying drawings.

Figure 1:
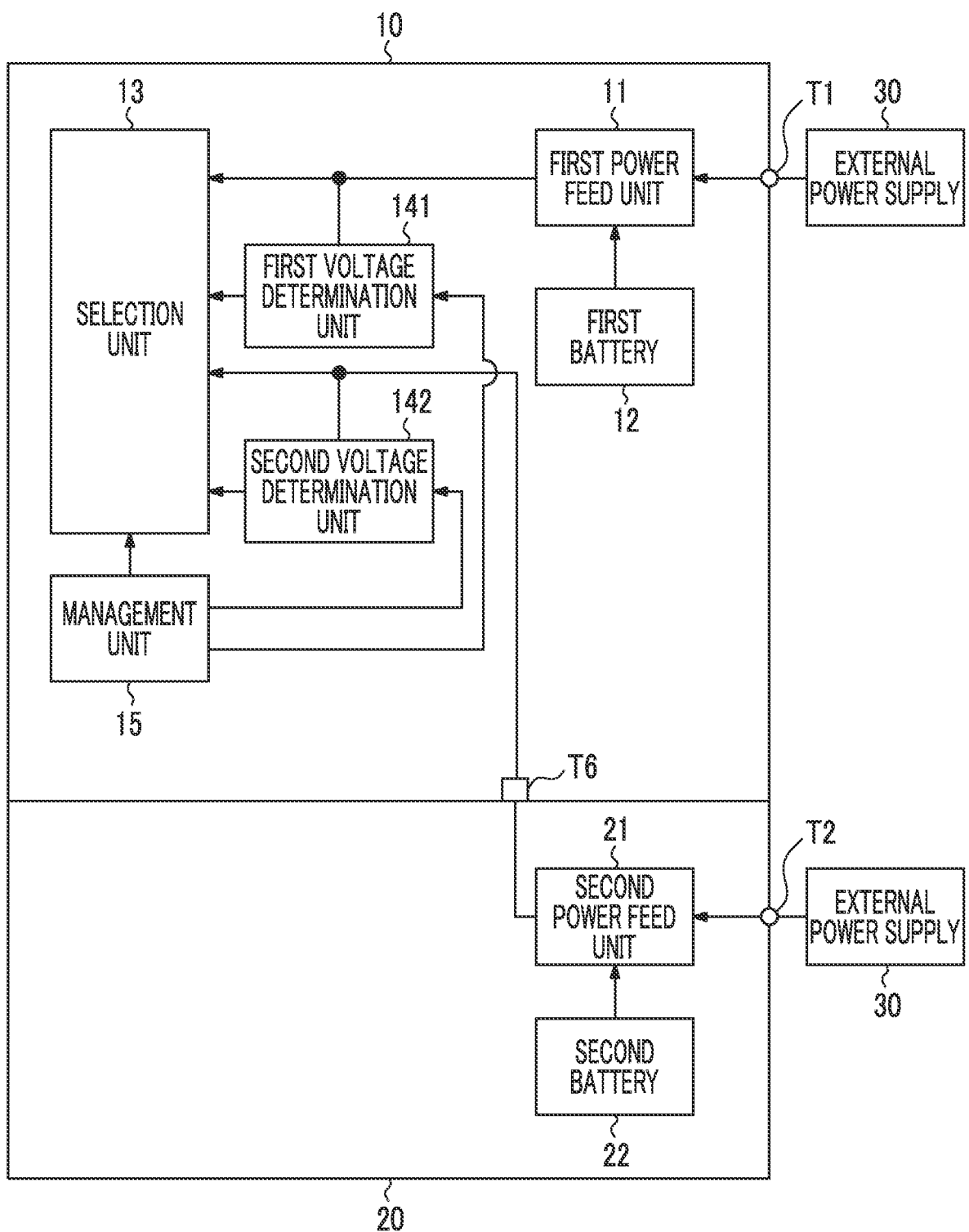
FIG. 1 is a block diagram showing a basic configuration example of a power supplying system according to the invention.

FIG. 1 is a block diagram showing a basic configuration example of a power supplying system according to the invention.

The power supplying system of this example is configured by including an electronic apparatus 10 and a connection apparatus 20 connectable to the electronic apparatus 10.

The electronic apparatus 10 is provided with a first power feed unit 11, and the connection apparatus 20 is provided with a second power feed unit 21. Further, the electronic apparatus 10 is provided with a connection apparatus power input terminal T6 which is a terminal to which power from the connection apparatus 20 is input.

The first power feed unit 11 provided in the electronic apparatus 10 can receive power (hereinafter referred to as "first internal power") from a first battery 12 in the electronic apparatus 10 and receive power (hereinafter referred to as "external power") from an external power supply 30 corresponding to a voltage higher than a valid battery voltage of the first battery 12, and preferentially outputs the external power from the external power supply 30 rather than the first internal power from the first battery 12.

The second power feed unit 21 provided in the connection apparatus 20 can receive power (hereinafter referred to as "second internal power") from a second battery 22 in the connection apparatus 20 and receive the external power from an external power supply 30 corresponding to the voltage higher than a valid battery voltage of the second battery 22, and preferentially outputs the external power from the external power supply 30 rather than the second internal power from the second battery 22.

In this specification, "can receive" the power refers to be connected to the power supply (first battery 12, second battery 22, or external power supply 30 in this example) wiredly or wirelessly. In a case of wireless connection, the power is supplied by power transmission using a magnetic field or an electric field.

The electronic apparatus 10 of this example is wiredly connected to the external power supply 30 through a first external power input terminal T1. The connection apparatus 20 of this example is wiredly connected to the external power supply 30 through a second external power input terminal T2.

The electronic apparatus 10 of this example is configured by including the first power feed unit 11 described above, the first battery 12 described above, a selection unit 13 that selects one of the first power feed unit 11 and the second power feed unit 21 as a supplying source of use power of the electronic apparatus 10, a first voltage determination unit 141 that compares a voltage of the output of the first power feed unit 11 with a first threshold value to determine whether the output of the first power feed unit 11 is valid or invalid, a second voltage determination unit 142 that compares a voltage of the output of the second power feed unit 21 with a second threshold value to determine whether the output of the second power feed unit 21 is valid or invalid, and a management unit 15 that causes the selection unit 13 to preferentially select a power feed unit that receives the external power between the first power feed unit 11 and the second power feed unit 21 and sets the first threshold value and the second threshold value.

As shown in FIG. 1, in a case where the external power supply 30 is connected to both the first power feed unit 11 of the electronic apparatus 10 and the second power feed unit 21 of the connection apparatus 20, the management unit 15 can cause the selection unit 13 to select a power feed unit with higher priority set in advance between the first power feed unit 11 and the second power feed unit 21.

Figure 2:
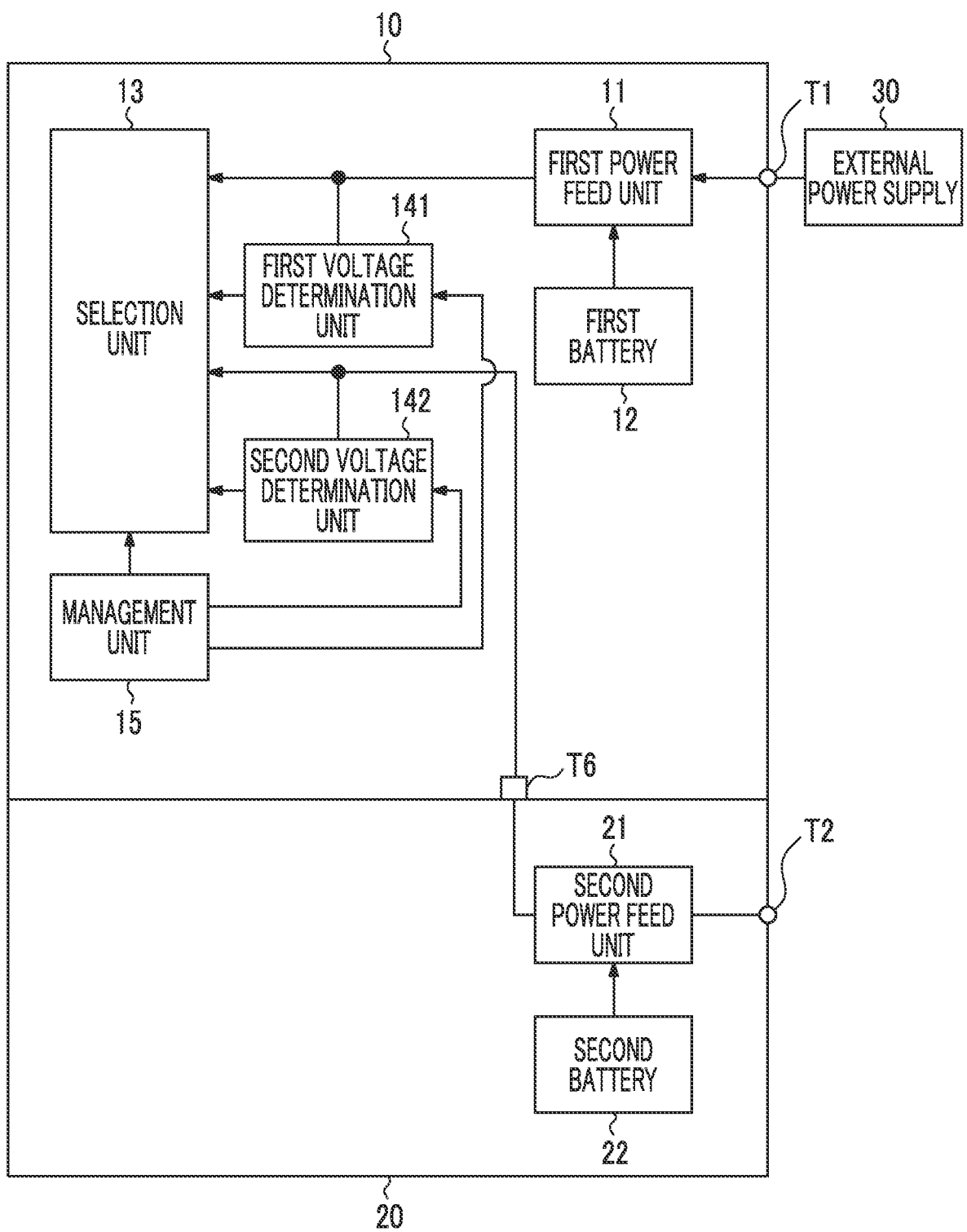
FIG. 2 is a block diagram showing a state where an external power supply is connected only to an electronic apparatus.
Figure 3:
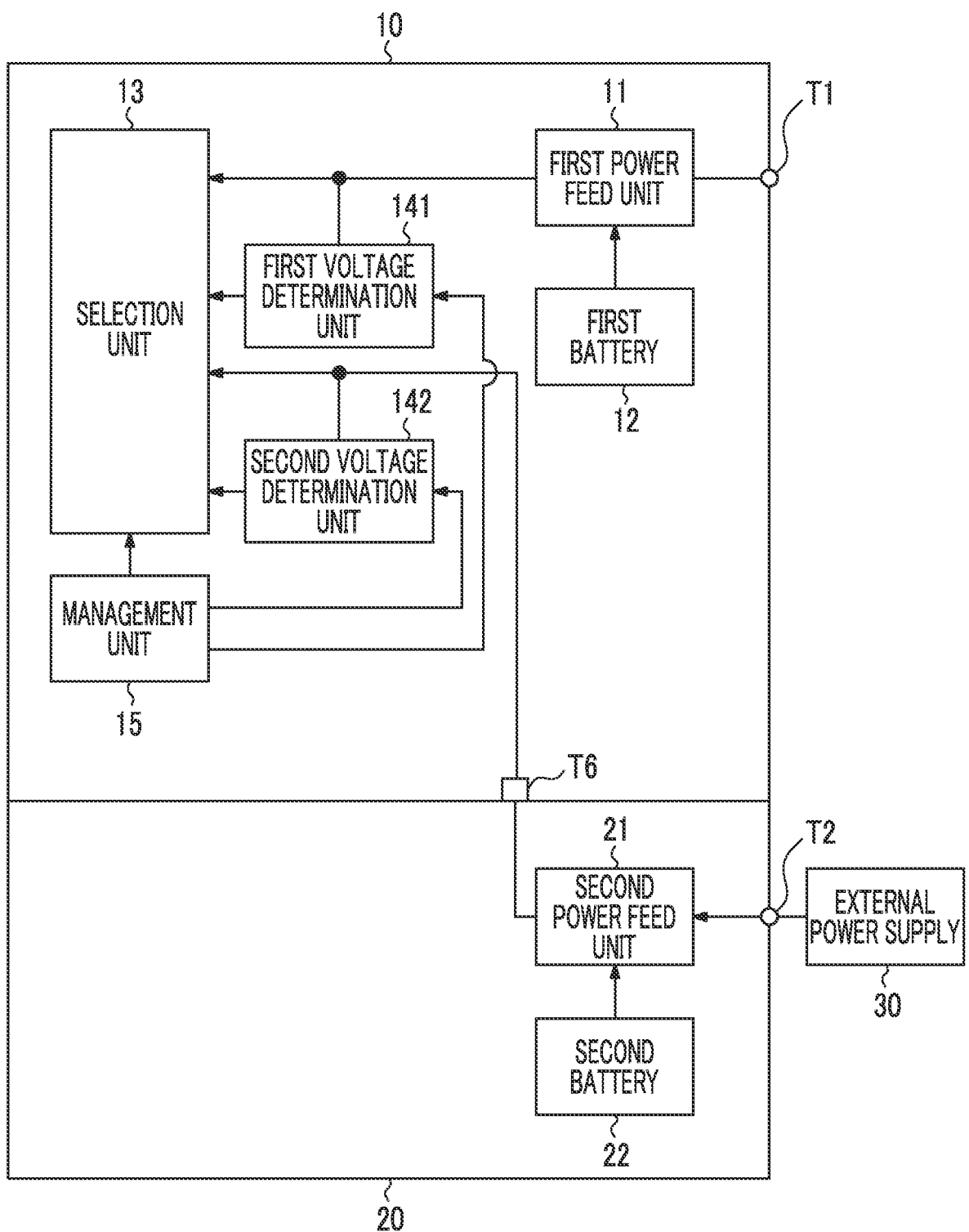
FIG. 3 is a block diagram showing a state where the external power supply is connected only to a connection apparatus.

As shown in FIGS. 2 and 3, in a case where the external power supply 30 is connected to one of the first power feed unit 11 of the electronic apparatus 10 and the second power feed unit 21 of the connection apparatus 20, the management unit 15 can cause the selection unit 13 to select a power feed unit to which the external power supply 30 is connected, between the first power feed unit 11 and the second power feed unit 21.

Figure 4:
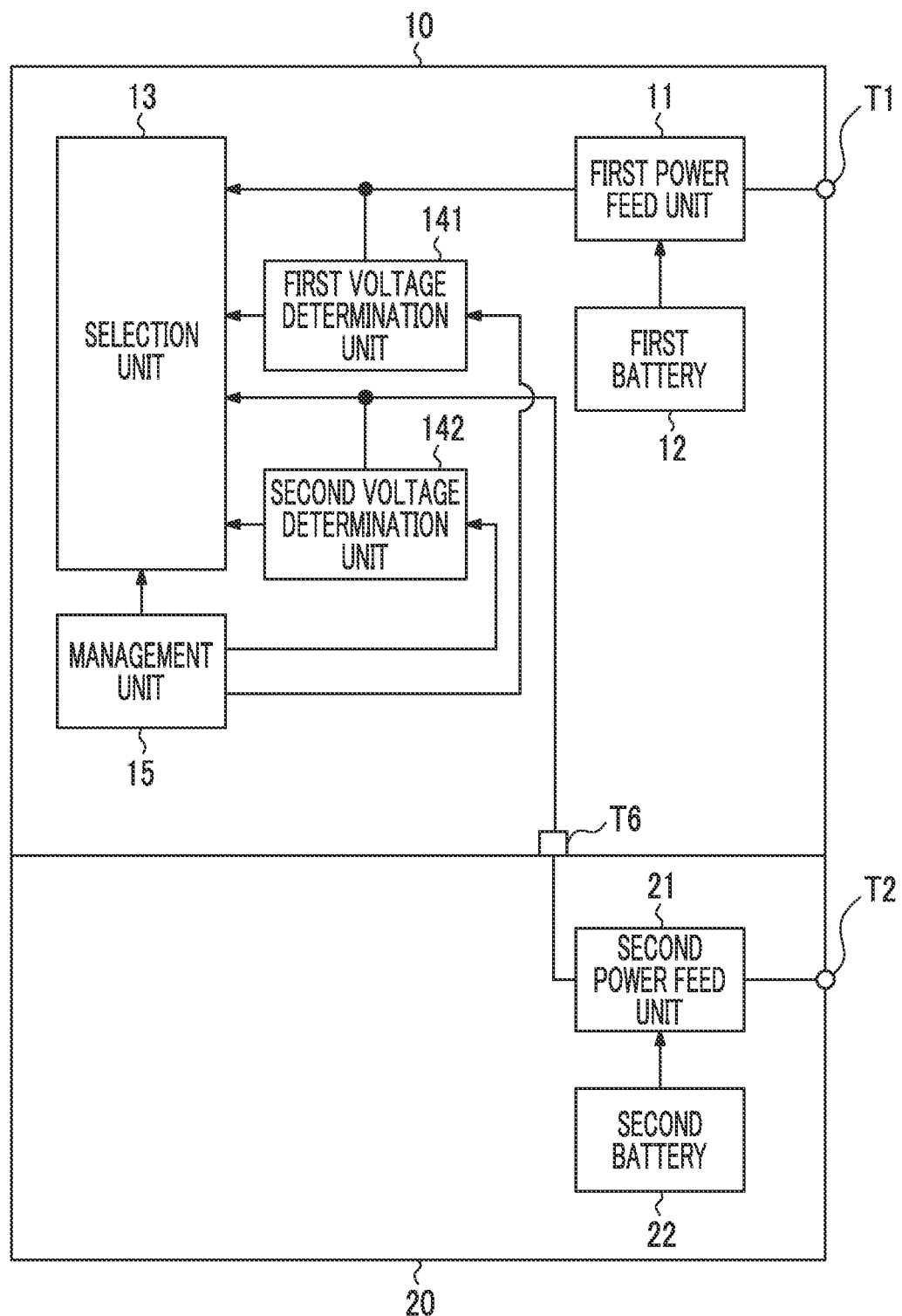
FIG. 4 is a block diagram showing a state where the external power supply is not connected to both the electronic apparatus and the connection apparatus.

As shown in FIG. 4, in a case where the external power supply 30 is not connected to both the first power feed unit 11 of the electronic apparatus 10 and the second power feed unit 21 of the connection apparatus 20, the management unit 15 can cause the selection unit 13 to select an power feed unit to which a battery (first battery 12 or second battery 22) with the valid battery voltage is connected, between the first power feed unit 11 and the second power feed unit 21. Further, in a case where both the first battery 12 and the second battery 22 have the valid voltages, the management unit 15 can cause the selection unit 13 to select a power feed unit with higher priority set in advance between the first power feed unit 11 and the second power feed unit 21. That is, it is possible to consume internal power in an order set in advance by software or the like.

The management unit 15 of this example sets the first threshold value to be compared with the output of the first power feed unit 11 by the first voltage determination unit 141 and the second threshold value to be compared with the output of the second power feed unit 21 by the second voltage determination unit 142 as shown in FIG. 5. Hereinafter, a threshold value setting of the management unit 15 will be described in detail.

The management unit 15 sets the first threshold value to be higher than the second threshold value in a "first condition" where there is the external power supply 30 connected to the first power feed unit 11, the first power feed unit 11 that receives the external power from the external power supply 30 is selected by the selection unit 13, and there is no first battery 12 with the valid battery voltage. The management unit 15 sets the second threshold value to be higher than the first threshold value in a "second condition" where there is the external power supply 30 connected to the second power feed unit 21, the second power feed unit 21 that receives the external power from the external power supply 30 is selected by the selection unit 13, and there is no second battery 22 with the valid battery voltage.

The management unit 15 of this example sets a voltage value to be higher than the valid voltages of the batteries 12 and 22 and lower than the voltage corresponding to the external power supply 30 as a higher threshold value between the first threshold value and the second threshold value. Further, the management unit 15 of this example sets a voltage value which is equal to or less than the valid voltages of the batteries 12 and 22 as a lower threshold value between the first threshold value and the second threshold value.

The first voltage determination unit 141 of this example determines that the output of the first power feed unit 11 is valid in a case where the output voltage of the first power feed unit 11 is equal to or larger than the first threshold value and determines that the output of the first power feed unit 11 is invalid in a case where the output voltage of the first power feed unit 11 is less than the first threshold value. Further, the second voltage determination unit 142 of this example determines that the output of the second power feed unit 21 is valid in a case where the output voltage of the second power feed unit 21 is equal to or larger than the second threshold value and determines that the output of the second power feed unit 21 is invalid in a case where the output voltage of the second power feed unit 21 is less than the second threshold value.

The selection unit 13 of this example switches a selection destination from the first power feed unit 11 to the second power feed unit 21 in a case where the output of the first power feed unit 11 is determined to be invalid by the first voltage determination unit 141 and the output of the second power feed unit 21 is determined to be valid by the second voltage determination unit 142 in a state where the first power feed unit 11 is selected. Further, the selection unit 13 switches the selection destination from the second power feed unit 21 to the first power feed unit 11 in a case where the output of the second power feed unit 21 is determined to be invalid by the second voltage determination unit 142 and the output of the first power feed unit 11 is determined to be valid by the first voltage determination unit 141 in a state where the second power feed unit 21 is selected.

The electronic apparatus 10 shown in FIG. 1 may have the following configuration. The electronic apparatus 10 of this example to which the connection apparatus 20 is connectable comprises the first power feed unit 11 that can receive the internal power from the first battery 12 provided in the electronic apparatus 10 and receive the external power from the external power supply 30 corresponding to the voltage higher than the valid battery voltage of the first battery 12, and preferentially outputs the external power rather than the internal power from the first battery 12, the connection apparatus power input terminal T6 to which the power from the connection apparatus 20 is input, the selection unit 13 that selects one of the first power feed unit 11 and the connection apparatus 20 as the supplying source of the use power of the electronic apparatus 10, the first voltage determination unit 141 that compares the voltage of the output of the first power feed unit 11 with the threshold value to determine whether the output of the first power feed unit 11 is valid or invalid, and the management unit 15 that sets the voltage value which is equal to or less than the valid voltage of the first battery 12 as the first threshold value, and sets the voltage value to be higher than the valid voltage of the first battery 12 and lower than the voltage corresponding to the external power supply 30 as the first threshold value in the condition where the first power feed unit 11 that receives the external power is selected by the selection unit 13 and there is no battery with the valid battery voltage. The selection unit 13 switches the selection destination to the connection apparatus 20 in the case where the output of the first power feed unit 11 is determined to be invalid by the first voltage determination unit 141 in the state where the first power feed unit 11 is selected.

Next, a specific example of the power supplying system shown in FIG. 1 will be described.

Figure 6:
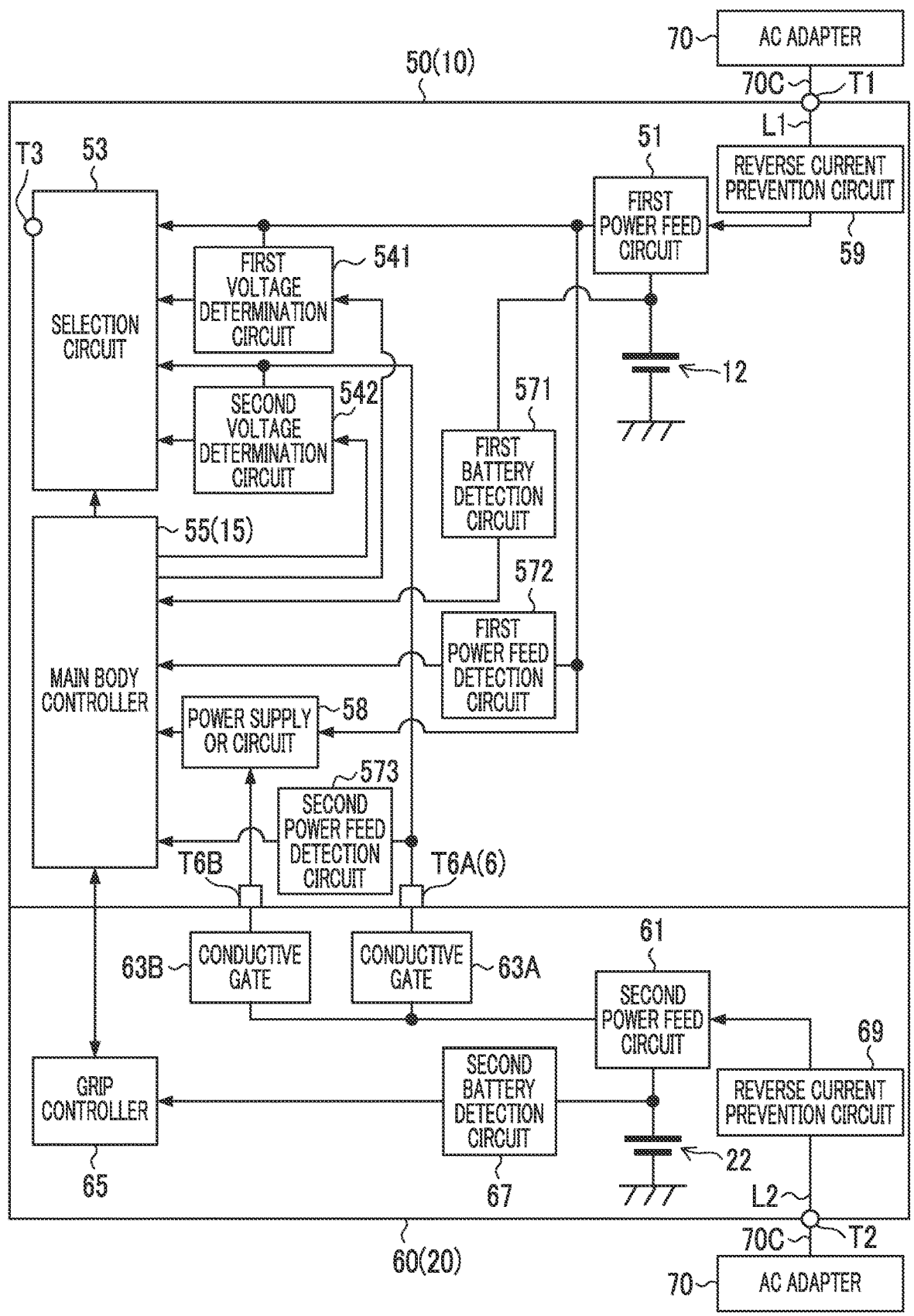
FIG. 6 is a block diagram showing main parts of one example of an electronic apparatus system in which the power supplying system shown in FIG. 1 is employed.

FIG. 6 is a block diagram showing main parts of one example of an electronic apparatus system in which the power supplying system shown in FIG. 1 is employed. The electronic apparatus system of this example is configured by including a digital camera 50 (one form of "electronic apparatus") and a grip 60 (one form of "connection apparatus") attachable to the digital camera 50. The grip 60 is one type of a functional unit having a specific function with the digital camera 50 as a main body. The "attachment" to the digital camera 50 is one form of "connection".

The digital camera 50 is provided with the first external power input terminal T1 to which the external power from an AC adapter 70 (one form of "external power supply") is input. A first power feed circuit 51 (one form of "first power feed unit") provided in the digital camera 50 can be electrically connected to the AC adapter 70 through a cable 70C, the first external power input terminal T1, and a reverse current prevention circuit 59 described below.

The grip 60 is provided with the second external power input terminal T2 to which the external power from an AC adapter 70 is input. A second power feed circuit 61 (one form of "second power feed unit") provided in the grip 60 can be electrically connected to the AC adapter 70 through a cable 70C, the second external power input terminal T2, and a reverse current prevention circuit 69 described below.

FIG. 6 shows a case where the AC adapter 70 is connected to both the first power feed circuit 51 and the second power feed circuit 61. However, there are cases where the AC adapter 70 is connected to only one of the first power feed circuit 51 and the second power feed circuit 61, and the AC adapter 70 is not connected to both the first power feed circuit 51 and the second power feed circuit 61 other than the case shown in FIG. 6.

The first power feed circuit 51 provided in the digital camera 50 is electrically connected to the first battery 12 in the digital camera 50. The first power feed circuit 51 preferentially outputs the power with a higher voltage between the first battery 12 and the AC adapter 70. The second power feed circuit 61 provided in the grip 60 is electrically connected to the second battery 22 in the grip 60. The second power feed circuit 61 preferentially outputs the power with a higher voltage between the second battery 22 and the AC adapter 70. Known circuits may be used as the first power feed circuit 51 and the second power feed circuit 61. A charge power feed circuit that can charge the first battery 12 with the external power from the AC adapter 70 is used as the first power feed circuit 51 of this example. A charge power feed circuit that can charge the second battery 22 with the external power from the AC adapter 70 is used as the second power feed circuit 61 of this example.

A selection circuit 53 (one form of "selection unit") provided in the digital camera 50 selects one of the first power feed circuit 51 and the second power feed circuit 61 as the supplying source of the use power of the digital camera 50. In this example, an output of the second power feed circuit 61 is supplied to the selection circuit 53 through a first conductive gate 63A and a first connection apparatus power input terminal T6A.

A first voltage determination circuit 541 (one form of "first voltage determination unit") provided in the digital camera 50 compares a voltage of an output of the first power feed circuit 51 with a first threshold value set by the first voltage determination circuit 541 to determine whether the output of the first power feed circuit 51 is valid or invalid.

A second voltage determination circuit 542 (one form of "second voltage determination unit") provided in the digital camera 50 compares the voltage of the output of the second power feed circuit 61 with a second threshold value set by the second voltage determination circuit 542 to determine whether the output of the second power feed circuit 61 is valid or invalid.

A main body controller 55 (one form of "management unit") provided in the digital camera 50 causes the selection circuit 53 to preferentially select a power feed unit that receives the external power from the AC adapter 70 between the first power feed circuit 51 and the second power feed circuit 61. Further, the main body controller 55 sets the first threshold value for the first voltage determination circuit 541 and sets the second threshold value for the second voltage determination circuit 542. The main body controller 55 is configured of, for example, a central processing unit (CPU).

The main body controller 55 of this example acquires detection results of a first battery detection circuit 571, a first power feed detection circuit 572, and the second power feed detection circuit 573 provided in the digital camera 50, and a detection result of a second battery detection circuit 67 provided in the grip 60. The main body controller 55 of this example instructs the selection circuit 53 to select and sets the threshold values (first threshold value and second threshold value) for the first voltage determination circuit 541 and the second voltage determination circuit 542 based on the acquired detection results.

The first battery detection circuit 571 provided in the digital camera 50 performs an analog to digital (AD) conversion to detect the voltage of the first battery 12 in the digital camera 50. The second battery detection circuit 67 provided in the grip 60 performs the AD conversion to detect the voltage of the second battery 22 in the grip 60. In this example, the detection result of the second battery detection circuit 67 is provided to the main body controller 55 through a grip controller 65. The grip controller 65 transmits the detection result to the main body controller 55 by, for example, serial communication. The grip controller 65 is configured of, for example, the central processing unit (CPU).

The first power feed detection circuit 572 provided in the digital camera 50 performs the AD conversion to detect the voltage of the output of the first power feed circuit 51. The second power feed detection circuit 573 provided in the digital camera 50 performs the AD conversion to detect the voltage of the output of the second power feed circuit 61.

The main body controller 55 sets the first threshold value to be higher than the second threshold value in a "first condition" where there is the AC adapter 70 electrically connected to the first power feed circuit 51, the first power feed circuit 51 that receives the external power from the AC adapter 70 is selected by the selection circuit 53, and there is no first battery 12 with the valid battery voltage. Further, the main body controller 55 sets the second threshold value to be higher than the first threshold value in a "second condition" where there is the AC adapter 70 electrically connected to the second power feed circuit 61, the second power feed circuit 61 that receives the external power from the AC adapter 70 is selected by the selection circuit 53, and there is no second battery 22 with the valid battery voltage. The first battery 12 and the second battery 22 of this example are rechargeable batteries (also referred to as "secondary battery"), and "there is no battery with the valid battery voltage" means that a voltage of the rechargeable battery is less than an allowable voltage (valid battery voltage) in a case of being used in the apparatus.

The digital camera 50 of this example is provided with a power supply OR circuit 58 that receives the output of the first power feed circuit 51 and the output of the second power feed circuit 61, performs OR of the output of the first power feed circuit 51 and the output of the second power feed circuit 61, and supplies the power to the main body controller 55. In this example, the output of the second power feed circuit 61 is supplied to the power supply OR circuit 58 through a second conductive gate 63B and a second connection apparatus power input terminal T6B.

The reverse current prevention circuits 59 and 69 are respectively provided in a path L1 (hereinafter referred to as "first external power feed path") from the first external power input terminal T1 to the first power feed circuit 51 of the digital camera 50 and a path L2 (hereinafter referred to as "second external power feed path") from the second external power input terminal T2 to the second power feed circuit 61 of the grip 60. The reverse current prevention circuit 59 provided in the digital camera 50 prevents a current from flowing from the AC adapter 70 connected to the second power feed circuit 61 to the AC adapter 70 connected to the first power feed circuit 51. The reverse current prevention circuit 69 provided in the grip 60 prevents a current from flowing from the AC adapter 70 connected to the first power feed circuit 51 to the AC adapter 70 connected to the second power feed circuit 61.

Figure 7:
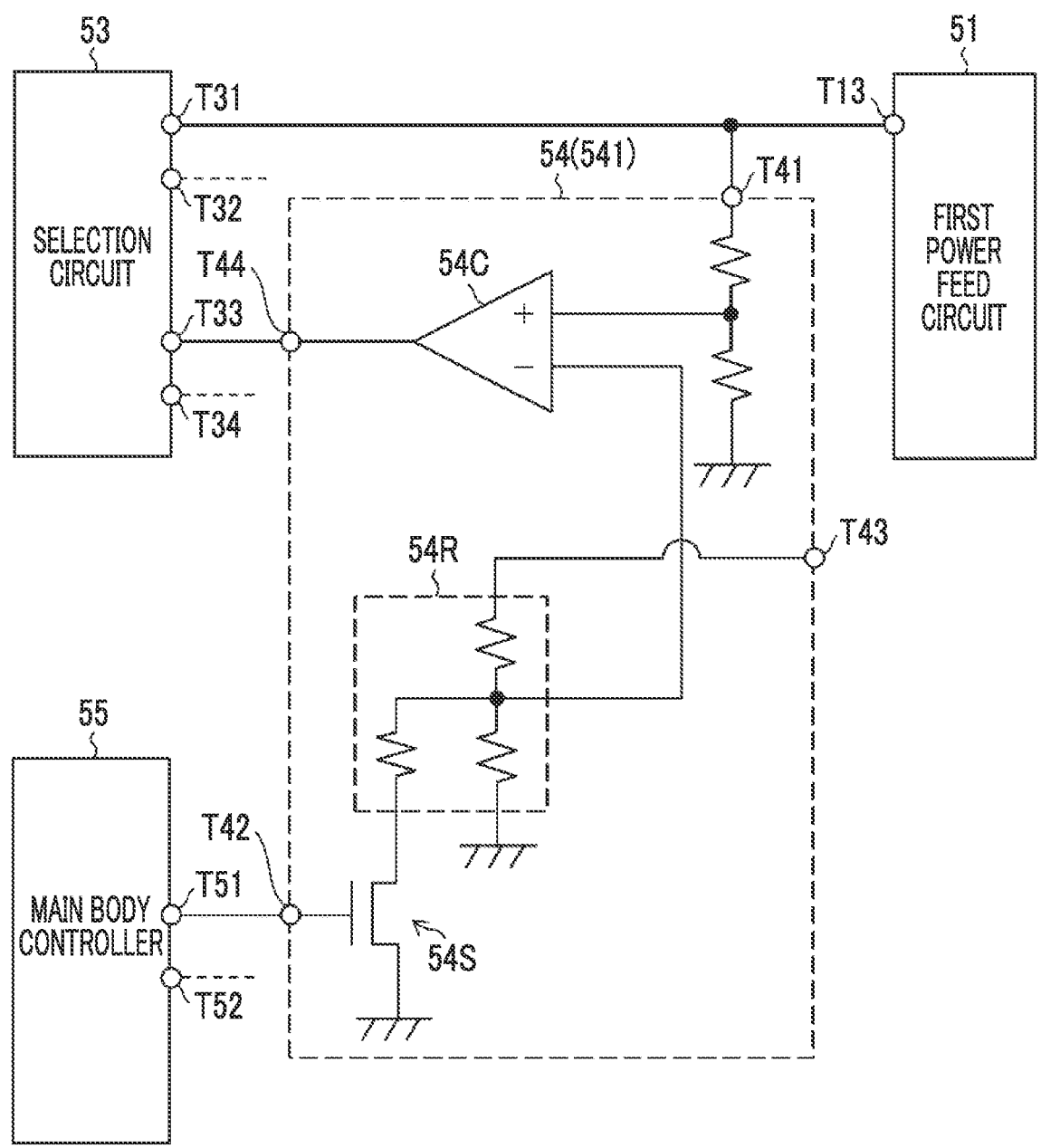
FIG. 7 is a diagram showing an example of a voltage determination circuit shown in FIG. 6.

FIG. 7 is a diagram showing an example of the first voltage determination circuit 541 shown in FIG. 6.

The first voltage determination circuit 541 of this example is configured by including a determination voltage input terminal T41 to which a voltage of a power output terminal T13 of the first power feed circuit 51 is input, an instruction input terminal T42 to which a threshold value setting instruction indicating which of a first threshold value candidate (hereinafter also referred to as "high threshold value") and a second threshold value candidate (hereinafter also referred to as "low threshold value") is used as the first threshold value from a first instruction output terminal T51 of the main body controller 55 is input, a reference voltage input terminal T43 to which a reference voltage is input, a determination result output terminal T44 that outputs a comparison result (hereinafter referred to as "first voltage determination result") between the output voltage of the first power feed circuit 51 (voltage of power output terminal T13) and the first threshold value to the selection circuit 53, a register element 54R that holds the first threshold value candidate and the second threshold value candidate, a switch element 54S that switches the first threshold value in response to the threshold value setting instruction which is input to the instruction input terminal T42, and a comparator 54C that compares the voltage which is input to the determination voltage input terminal T41 with the first threshold value. The reference voltage is input from, for example, the power supply OR circuit 58 to the reference voltage input terminal T43.

The second voltage determination circuit 542 shown in FIG. 6 is omitted in FIG. 7, but the same configuration as the first voltage determination circuit 541 may be employed. That is, the second voltage determination circuit 542 of this example may include the determination voltage input terminal T41 to which a voltage of a power output terminal of the second power feed circuit 61 is input, the instruction input terminal T42 to which the threshold value setting instruction indicating which of the first threshold value candidate (high threshold value) and the second threshold value candidate (low threshold value) is used as the second threshold value from a second instruction output terminal T52 of the main body controller 55 is input, the reference voltage input terminal T43 to which the reference voltage is input, the determination result output terminal T44 that outputs a comparison result (hereinafter referred to as "second voltage determination result") between the output voltage of the second power feed circuit 61 and the second threshold value to the selection circuit 53, the register element 54R that holds the first threshold value candidate and the second threshold value candidate, the switch element 54S that switches the second threshold value in response to the threshold value setting instruction which is input to the instruction input terminal T42, and the comparator 54C that compares the voltage which is input to the determination voltage input terminal T41 with the second threshold value. In the following description, the first voltage determination circuit 541 and the second voltage determination circuit 542 may be collectively referred to as "voltage determination circuit 54".

FIG. 7 shows the configuration of directly comparing the voltage value corresponding to the output voltage of the first power feed circuit 51 which is input to the determination voltage input terminal T41 with the voltage value corresponding to the threshold value held in the register element 54R, but the invention is not limited to such a case. The output voltage of the first power feed circuit 51 may be compared with the threshold value by the entire voltage determination unit (voltage determination circuits 541 and 542). For example, a configuration may be employed in which the register element 54R and the switch element 54S are provided between the determination voltage input terminal T41 and the comparator 54C to multiply a coefficient corresponding to the threshold value to the voltage value corresponding to the output voltage of the first power feed circuit 51 which is input to the determination voltage input terminal T41, and then the multiplied voltage value is compared with the reference voltage which is input to the reference voltage input terminal T43. That is, a circuit that relatively compares the voltage value corresponding to the output voltage of the first power feed circuit 51 with the voltage value corresponding to the threshold value may be used.

The first voltage determination circuit 541 described above compares the output voltage of the first power feed circuit 51 with the first threshold value in analog. Similarly, the second voltage determination circuit 542 compares the output voltage of the second power feed circuit 61 with the second threshold value in analog. That is, the main body controller 55 of this example only instructs the voltage determination circuit 54 (541 and 542) to select which of the first threshold value candidate and the second threshold value candidate, and the voltage determination is instantaneously (for example, in several microseconds) performed by the voltage determination circuit 54.

Figure 8:
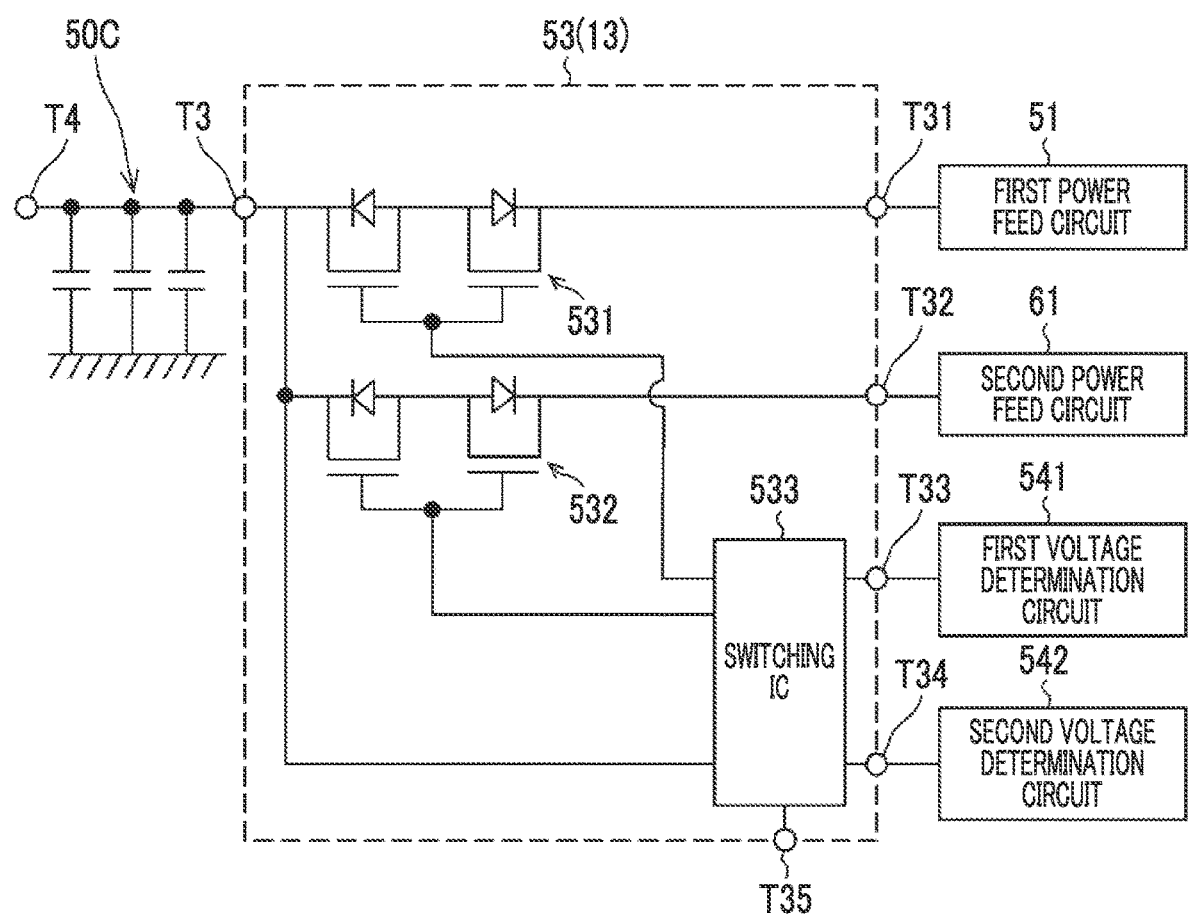
FIG. 8 is a diagram showing an example of a selection circuit shown in FIG. 6.

FIG. 8 is a diagram showing an example of the selection circuit 53 shown in FIG. 6.

The selection circuit 53 of this example is configured by including a first selection power input terminal T31 to which the output of the first power feed circuit 51 is input, a second selection power input terminal T32 to which the output of the second power feed circuit 61 is input, a first determination result input terminal T33 to which the first voltage determination result of the first voltage determination circuit 541 is input, a second determination result input terminal T34 to which the second voltage determination result of the second voltage determination circuit 542 is input, an instruction input terminal T35 to which an instruction from a main body controller 55 is input, a selection power output terminal T3 that outputs the power from the selected power feed circuit between the first power feed circuit 51 and the second power feed circuit 61, a first switch element 531 that switches whether to select the output of the first power feed circuit 51 which is input to the first selection power input terminal T31, a second switch element 532 that switches whether to select the output of the second power feed circuit 61 which is input to the second selection power input terminal T32, and a switching integrated circuit (IC) 533 that outputs a switching instruction to the first switch element 531 and the second switch element 532 based on the first voltage determination result which is input to the first determination result input terminal T33 and the second voltage determination result which is input to the second determination result input terminal T34. In this example, condensers 50C (capacitors) and a selection power supplying terminal T4 for supplying the power of the selected power feed circuit to each unit of the digital camera 50 are connected to the selection power output terminal T3 of the selection circuit 53.

The main body controller 55 of this example sets the first threshold value to be higher than the second threshold value used in the second voltage determination circuit 542 for the first voltage determination circuit 541 in the first condition shown in FIG. 5. Specifically, the main body controller 55 sets a voltage value (high threshold value) to be higher than the valid voltage of the first battery 12 and lower than the voltage of the AC adapter 70 as the first threshold value. It is preferable to set a voltage value to be higher than a maximum voltage of the first battery 12 as the first threshold value. Further, a voltage value (low threshold value) which is equal to or less than the valid voltage of the second battery 22 is set as the second threshold value. For example, a termination voltage value of the second battery 22 is set as the second threshold value.

Further, the main body controller 55 of this example sets the second threshold value to be higher than the first threshold value used in the first voltage determination circuit 541 for the second voltage determination circuit 542 in the second condition shown in FIG. 5. Specifically, the main body controller 55 sets a voltage value (high threshold value) to be higher than the valid voltage of the second battery 22 and lower than the voltage of the AC adapter 70 as the second threshold value. It is preferable to set a voltage value to be higher than a maximum voltage of the second battery 22 as the second threshold value. Further, a voltage value (low threshold value) which is equal to or less than the valid voltage of the first battery 12 is set as the first threshold value. For example, a termination voltage value of the first battery 12 is set as the first threshold value.

In this example, the valid voltage of the first battery 12 is equal to the valid voltage of the second battery 22. However, the invention may be employed also in a case where the valid voltage of the first battery 12 differs from the valid voltage of the second battery 22. The voltage of the AC adapter 70 is higher than the valid voltage of the first battery 12 and the valid voltage of the second battery 22.

In this example, the high threshold value and the low threshold value described above are held by the register element 54R of the voltage determination circuit 54 (first voltage determination circuit 541 and second voltage determination circuit 542) as the threshold value candidates. In a case where it is instructed from the instruction output terminals (first instruction output terminal T51 and second instruction output terminal T52) of the main body controller 55 that which of a plurality of threshold value candidates is selected as the actual threshold value (first threshold value and second threshold value), the actual threshold value is selected from the plurality of threshold value candidates by the switch element 54S of the voltage determination circuit 54 according to the instruction and the voltage determination is performed by the comparator 54C of the voltage determination circuit 54 based on the selected threshold value. In a case where the voltage determination result of the voltage determination circuit 54 (541 and 542) is changed, the switching IC 533 of the selection circuit 53 switches the switch elements 531 and 532 of the selection circuit 53 and the supplying source of the use power of the digital camera 50 (electronic apparatus) according to the change in the voltage determination result. That is, in a case where the cable 70C of the AC adapter 70 is removed, the selection circuit 53 can instantaneously (for example, in several microseconds) complete the switching of the supplying source of the use power without waiting for the instruction from the main body controller 55.

Figure 9:
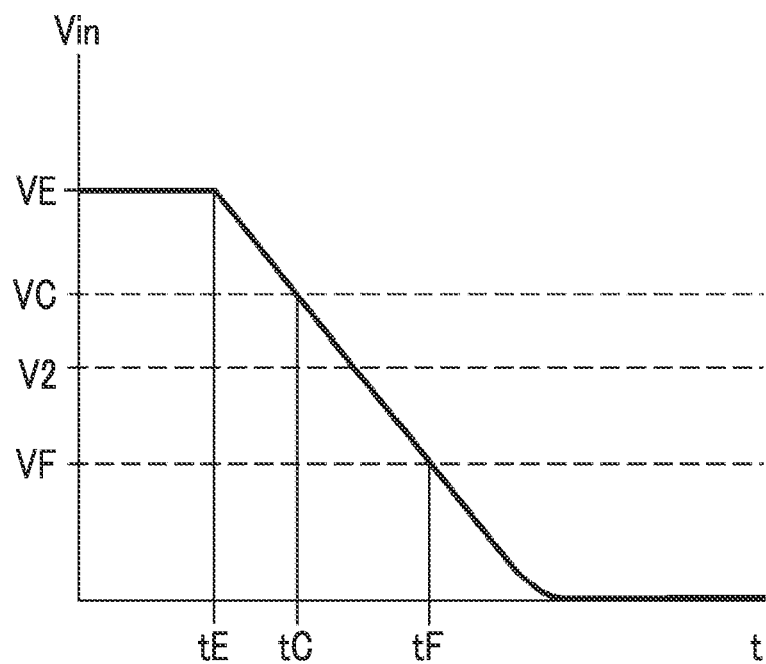
FIG. 9 is a diagram showing an example of a drop in an input voltage to the selection circuit in a case where supply of external power is disconnected in an apparatus having no battery with a valid voltage.

A relationship between a voltage drop and a switching timing due to disconnection of the supplying of the external power will be described using FIG. 9. It is assumed that the cable 70C of the AC adapter 70 is removed from the first external power input terminal T1 of the digital camera 50. In a case where the first battery 12 in the digital camera 50 has no valid voltage, an input voltage Vin (equal to voltage of power output terminal T13 of first power feed circuit 51 in this example) of the first selection power input terminal T31 of the selection circuit 53 drops with the lapse of time t from a voltage VE of the AC adapter 70 as shown in FIG. 9. In the related art, since it takes time from the removal of the cable 70C of the AC adapter 70 to the completion of the switching, the apparatus may be abnormally ended. In this example, since the first threshold value set high is compared with the input voltage Vin and the supplying source of the use power can be switched according to the comparison result (voltage determination result) without waiting for the instruction of the main body controller 55, it is possible to surely prevent the abnormal end of the digital camera 50 even in the case where the cable 70C of the AC adapter 70 is removed. For example, it is assumed that the switching of the supplying source of the use power is completed at time tC (between removal time tE of the cable 70C and time tF at which the input voltage Vin drops to a termination voltage VF of the first battery 12) shown in FIG. 9. That is, when the input voltage Vin drops to a voltage VC in FIG. 9, the switching is completed. With this, in a case where the second battery 22 in the grip 60 has the valid voltage, the output voltage (voltage at selection power output terminal T3 and selection power supplying terminal T4) of the selection circuit 53 is not reduced less than the termination voltage VF. In other words, in a case where the second threshold value is the termination voltage VF, it is possible to complete the switching until the input voltage Vin drops to the second threshold value. It is also possible to complete the switching until the input voltage Vin drops to a target voltage V2 (for example, a voltage value higher than the termination voltage VF) in a case where the second battery 22 is used.

It can be said that the selection circuit 53 of this example completes the switching to the second power feed circuit 61 until the voltage of the output of the first power feed circuit 51 drops to the second threshold value in the case where the cable 70C of the AC adapter 70 connected to the first power feed circuit 51 is removed and the selection destination is switched from the first power feed circuit 51 to the second power feed circuit 61. Further, it can be said that the selection circuit 53 of this example completes the switching to the first power feed circuit 51 until the voltage of the output of the second power feed circuit 61 drops to the first threshold value in the case where the cable 70C of the AC adapter 70 connected to the second power feed circuit 61 is removed and the selection destination is switched from the second power feed circuit 61 to the first power feed circuit 51.

As described above, the abnormal end of the digital camera 50 does not occur even in the case where the external power on the digital camera 50 side is disconnected in the state where the battery voltage of the first battery 12 in the digital camera 50 (electronic apparatus) is not valid. Similarly, the abnormal end of the digital camera 50 does not occur also in the case where the external power on the grip 60 side is disconnected in the state where the battery voltage of the second battery 22 in the grip 60 (connection apparatus) is not valid.

Figure 10:
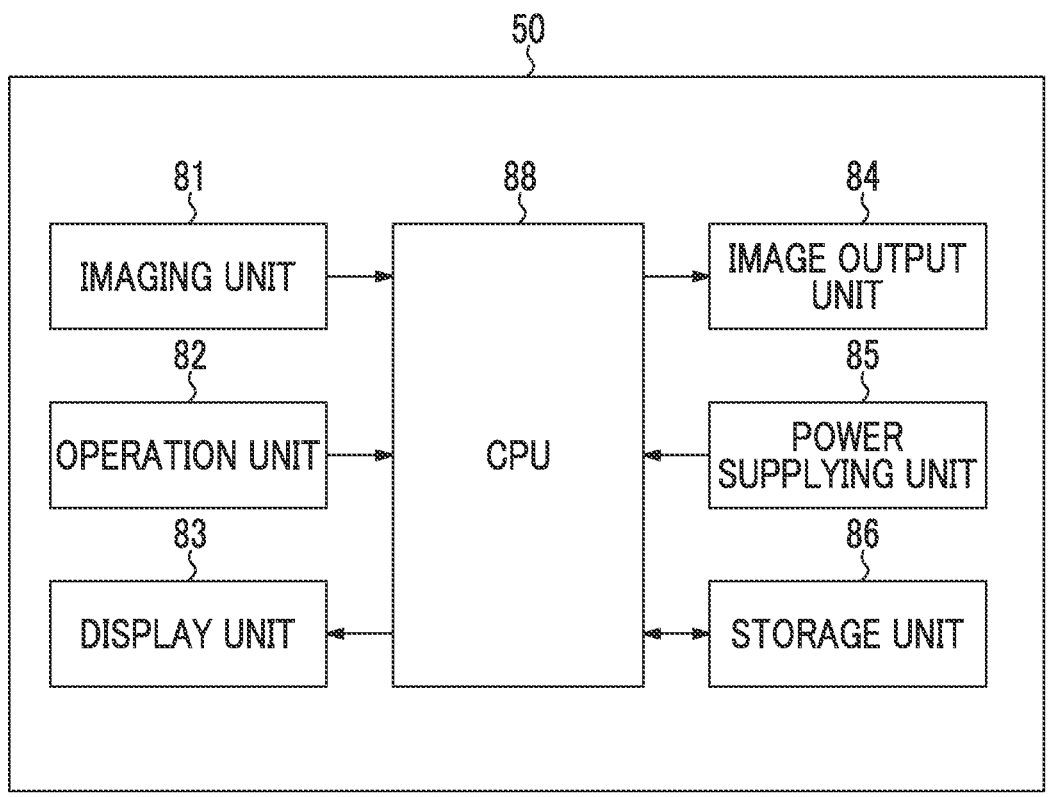
FIG. 10 is a block diagram showing an overall configuration example of a digital camera.

FIG. 6 shows the components relating to a power supplying function of the digital camera 50, but the digital camera 50 comprises components having functions other than the power supplying as exemplified in FIG. 10 (block diagram showing an overall configuration example of digital camera 50).

The digital camera 50 shown in FIG. 10 comprises an imaging unit 81 that images an object, an operation unit 82 that receives the instruction input by a user, a display unit 83 that displays various types of pieces of information including an image to the user, an image output unit 84 that outputs the image to the outside, a power supplying unit 85 that supplies the power to each necessary unit of the digital camera 50, a storage unit 86 having a transitory storage device and a non-transitory storage device, and a central processing unit (CPU) 88 that controls each unit of the digital camera 50 according to a program stored in the non-transitory storage device of the storage unit 86. The power supplying unit 85 of this example is configured by including the first power feed circuit 51, the selection circuit 53, the voltage determination circuit 54 (541 and 542), the power supply OR circuit 58, and the reverse current prevention circuit 59 shown in FIG. 6. The main body controller 55 of FIG. 6 may be included in the power supplying unit 85 or may be configured of the CPU 88.

<Variations of External Power>

Variations of the external power will be described.

FIG. 6 shows the example that the external power from the AC adapter 70 outside the apparatus is supplied, but the invention is not limited to such a case. The invention can be employed in a case where various types of external power are used.

First, the invention is not limited to the case where the AC adapter is provided outside the apparatus and can be also employed in a case where the AC adapter is provided in the apparatus. In this case, the AC power supply (alternating current power supply) corresponds to the external power supply. At least one of the first power feed unit in the apparatus or the second power feed unit in the connection apparatus may be wiredly connected to the AC power supply outside the apparatus through the AC adapter in the apparatus. In the case where the AC adapter is provided in the apparatus, an output voltage of the AC adapter may be "voltage higher than the valid battery voltage of the battery".

Second, the invention is not limited to the case where the apparatus is wiredly connected to the external power supply and can be employed also in a case where the apparatus is wirelessly connected to the external power supply. In this case, the external power may be supplied to the power feed units (first power feed unit and second power feed unit) in the apparatus by power transmission using the magnetic field or the electric field.

Third, the invention is not limited to the case where the external power supply is non-battery power supply and can be employed in a case where the external power supply is referred to as so-called "battery". In this case, "first battery" and "second battery" are the batteries in the apparatus (built-in batteries), and "external power supply" is the battery outside the apparatus. For example, in a case where the apparatus can be mounted on a vehicle, an on-vehicle battery outside the apparatus may be used as the external power supply. For example, in a case where the apparatus is used indoors, an outdoor solar cell may be used as the external power supply.

<Variation of Apparatus>

Variations of the electronic apparatus and the connection apparatus will be described.

Figure 11:
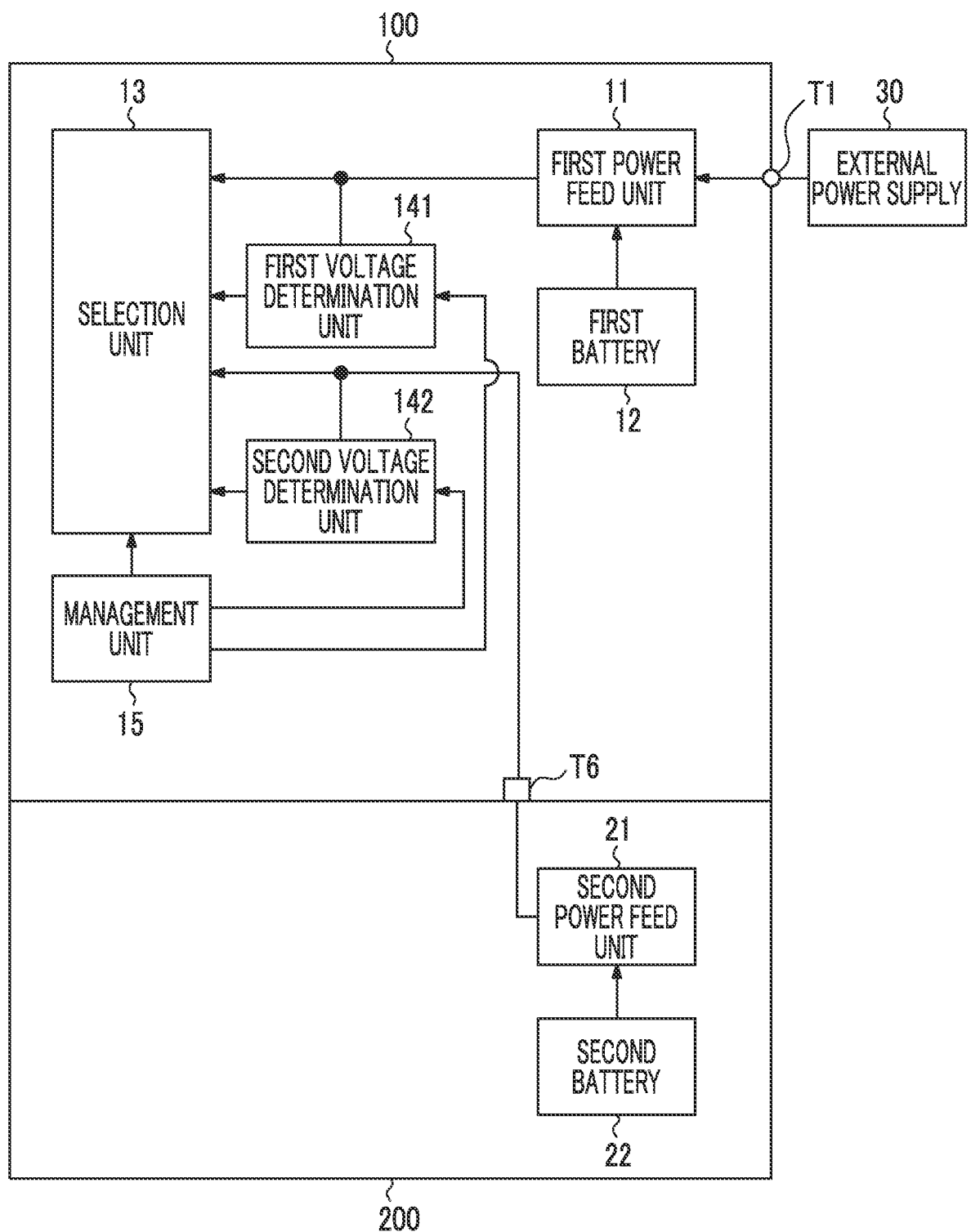
FIG. 11 is a block diagram showing main parts of another example of the electronic apparatus according to the invention.

FIGS. 1 and 6 show the case where both the electronic apparatus and the connection apparatus can receive the internal power from the built-in battery and the external power from the external power supply. However, only the electronic apparatus 100 may be able to receive the internal power and the external power and the connection apparatus 200 may be able to receive only the internal power as shown in FIG. 11. In FIG. 11, the same reference numerals are assigned to the configuration components described in FIG. 1 and the contents already described may be omitted.

The connection apparatus 200 is connectable to the electronic apparatus 100 of this example.

The first power feed unit 11 provided in the electronic apparatus 100 can receive the internal power from the first battery 12 and receive the external power from the external power supply 30 having the voltage higher than the valid battery voltage of the first battery 12, and preferentially outputs the external power rather than the internal power from the first battery 12. The power from the connection apparatus 200 is input to the connection apparatus power input terminal T6.

The selection unit 13 selects one of the first power feed unit 11 and the connection apparatus 200 as the supplying source of the use power of the electronic apparatus 100.

The first voltage determination unit 141 compares the voltage of the output of the first power feed unit 11 with the threshold value to determine whether the output of the first power feed unit 11 is valid or invalid. The second voltage determination unit 142 determines whether the output of the connection apparatus 200 is valid or invalid.

The management unit 15 sets the voltage value which is equal to or less than the valid voltage of the first battery 12 as the threshold value for the first voltage determination unit 141, and sets the voltage value to be higher than the valid voltage of the first battery 12 and lower than the voltage of the external power supply as the threshold value in the condition where the first power feed unit 11 that receives the external power is selected by the selection unit 13 and there is no first battery 12 with the valid battery voltage. The selection unit 13 switches the selection destination to the connection apparatus 200 in the case where the output of the first power feed unit 11 is determined to be invalid by the first voltage determination unit 141 in the state where the first power feed unit 11 is selected.

Further, FIG. 6 shows the case where the connection apparatus is attachable to the electronic apparatus, but the invention is not limited to such a case. The invention can be employed in the case where the electronic apparatus and the connection apparatus are wiredly connected by the cable and also in the case where the electronic apparatus and the connection apparatus are wirelessly connected.

Further, the digital camera (camera main body) and the grip are introduced as a combination of the electronic apparatus and the connection apparatus in FIG. 6, but the invention is not limited to such a case. The invention can be employed in various combinations of a plurality of apparatuses.

The forms for implementing the invention have been described. However, the invention is not limited to the embodiments and the modification examples described above, and various modifications are possible without departing from the gist of the invention.

EXPLANATION OF REFERENCES 10, 100: electronic apparatus
11: first power feed unit
12: first battery
13: selection unit
15: management unit
20, 200: connection apparatus
21: second power feed unit
22: second battery
30: external power supply
50: digital camera
50C: condenser
51: first power feed circuit
53: selection circuit
54: voltage determination circuit
54C: comparator
54R: register element
54S: switch element
55: main body controller
58: power supply OR circuit
59: reverse current prevention circuit
60: grip
61: second power feed circuit
63A: first conductive gate
63B: second conductive gate
65: grip controller
67: second battery detection circuit
69: reverse current prevention circuit
70: AC adapter
70C: cable
81: imaging unit
82: operation unit
83: display unit
84: image output unit
85: power supplying unit
86: storage unit
88: CPU
141: first voltage determination unit
142: second voltage determination unit
531: first switch element
532: second switch element
533: switching IC
541: first voltage determination circuit
542: second voltage determination circuit
571: first battery detection circuit
572: first power feed detection circuit
573: second power feed detection circuit
L1, L2: external power feed path
T1, T2: external power input terminal
T3: selection power output terminal
T4: selection power supplying terminal
T13: power output terminal
T31, T32: selection power input terminal
T33, T34: determination result input terminal
T35: instruction input terminal
T41: determination voltage input terminal
T42: instruction input terminal
T43: reference voltage input terminal
T44: determination result output terminal
T51, T52: instruction output terminal
T6, T6A, T6B: connection apparatus power input terminal

What is claimed is:

1. An electronic apparatus to which a connection apparatus is connectable, the electronic apparatus comprising:
a first power feed unit that is capable of receiving internal power from a first battery in the electronic apparatus and of receiving external power from an external power supply which is a voltage higher than a valid battery voltage of the first battery, and preferentially outputs the external power rather than the internal power;
a selection unit that selects one of the first power feed unit and a second power feed unit that is provided to the connection apparatus and feeds power to the electronic apparatus from the connection apparatus, as a supplying source of use power of the electronic apparatus;
a first voltage determination unit that compares a voltage of an output of the first power feed unit with a first threshold value to determine whether the output of the first power feed unit is valid or invalid;
a second voltage determination unit that compares a voltage of an output of the second power feed unit with a second threshold value to determine whether the output of the second power feed unit is valid or invalid; and
a management unit that sets the first threshold value to be higher than the second threshold value in a first condition where the first power feed unit that receives the external power is selected by the selection unit and there is no first battery with the valid battery voltage,
wherein the selection unit switches a selection destination to the second power feed unit in a case where the output of the first power feed unit is determined to be invalid by the first voltage determination unit and the output of the second power feed unit is determined to be valid by the second voltage determination unit in a state where the first power feed unit is selected.

2. The electronic apparatus according to claim 1, wherein the selection unit completes the switching to the second power feed unit until the voltage of the output of the first power feed unit drops to the second threshold value in the case where the selection destination is switched from the first power feed unit to the second power feed unit in the first condition.

3. The electronic apparatus according to claim 1, wherein the management unit sets a voltage value to be higher than a valid voltage of the first battery and lower than a voltage corresponding to the external power supply as a higher threshold value between the first threshold value and the second threshold value.

4. The electronic apparatus according to claim 3,
wherein the management unit sets a voltage value which is equal to or less than the valid voltage of the first battery as a lower threshold value between the first threshold value and the second threshold value.

5. The electronic apparatus according to claim 1,
wherein the first voltage determination unit compares the voltage of the output of the first power feed unit with the first threshold value in analog, and
wherein the second voltage determination unit compares the voltage of the output of the second power feed unit with the second threshold value in analog.

6. The electronic apparatus according to claim 1, further comprising:
a reverse current prevention circuit that prevents a current from flowing to the external power supply connected to the first power feed unit.

7. The electronic apparatus according to claim 1, further comprising:
a power supply OR circuit that receives the output of the first power feed unit and the output of the second power feed unit, and supplies the power to the management unit.

8. A digital camera included in the electronic apparatus according to claim 1,
wherein the connection apparatus is a battery grip.

9. An electronic apparatus to which a connection apparatus is connectable, the electronic apparatus comprising:
a first power feed unit that is capable of receiving internal power from a first battery and of receiving external power which is a voltage higher than a valid battery voltage of the first battery, and preferentially outputs the external power rather than the internal power from the first battery;
a connection apparatus power input terminal electrically connected to a second power feed unit that is provided in the connection apparatus, the second power feed unit is capable of receiving internal power from a second battery and of receiving the external power which is a voltage higher than a valid battery voltage of the second battery, and the second power feed unit preferentially outputs the external power rather than the internal power from the second battery;
a selection unit that selects one of the first power feed unit and the second power feed unit and sets the selected power feed unit as a supplying source of use power of the electronic apparatus;
a first voltage determination unit that compares a voltage of an output of the first power feed unit with a first threshold value to determine whether the output of the first power feed unit is valid or invalid;
a second voltage determination unit that compares a voltage of an output of the second power feed unit with a second threshold value to determine whether the output of the second power feed unit is valid or invalid; and
a management unit, causing the selection unit to preferentially select a power feed unit that receives the external power between the first power feed unit and the second power feed unit and setting the first threshold value and the second threshold value, that sets the first threshold value to be higher than the second threshold value in a first condition where the first power feed unit that receives the external power is selected by the selection unit and there is no first battery with the valid battery voltage, and that sets the second threshold value to be higher than the first threshold value in a second condition where the second power feed unit that receives the external power is selected by the selection unit and there is no second battery with the valid battery voltage,
wherein the selection unit switches a selection destination to the second power feed unit in a case where the output of the first power feed unit is determined to be invalid by the first voltage determination unit and the output of the second power feed unit is determined to be valid by the second voltage determination unit in a state where the first power feed unit is selected, and switches the selection destination to the first power feed unit in a case where the output of the second power feed unit is determined to be invalid by the second voltage determination unit and the output of the first power feed unit is determined to be valid by the first voltage determination unit in a state where the second power feed unit is selected, and
the selection unit completes the switching to the second power feed unit until the voltage of the output of the first power feed unit drops to the second threshold value in the case where the selection destination is switched from the first power feed unit to the second power feed unit in the first condition.

10. The electronic apparatus according to claim 9,
wherein the selection unit completes the switching to the first power feed unit until the voltage of the output of the second power feed unit drops to the first threshold value in the case where the selection destination is switched from the second power feed unit to the first power feed unit in the second condition.

11. The electronic apparatus according to claim 9,
wherein the management unit sets a voltage value to be higher than a valid voltage of the first battery and the second battery and lower than a voltage corresponding to the external power supply as a higher threshold value between the first threshold value and the second threshold value.

12. The electronic apparatus according to claim 11,
wherein the management unit sets a voltage value which is equal to or less than the valid voltage of the first battery and the second battery as a lower threshold value between the first threshold value and the second threshold value.

13. The electronic apparatus according to claim 9,
wherein the first voltage determination unit compares the voltage of the output of the first power feed unit with the first threshold value in analog, and
wherein the second voltage determination unit compares the voltage of the output of the second power feed unit with the second threshold value in analog.

14. The electronic apparatus according to claim 9, further comprising:
a reverse current prevention circuit that prevents a current from flowing from one external power supply to the other external power supply of the external power supply connected to the first power feed unit and the external power supply connected to the second power feed unit.

15. The electronic apparatus according to claim 9, further comprising:
a power supply OR circuit that receives the output of the first power feed unit and the output of the second power feed unit, and supplies the power to the management unit.

* * * * *